(12) United States Patent  
Lin

(10) Patent No.: US 12,170,128 B2  
(45) Date of Patent: Dec. 17, 2024

(54) CIRCUIT FOR SYNCHRONIZATION FOR AN INTERCONNECTION PROTOCOL, CONTROLLER AND STORAGE DEVICE

(71) Applicant: SK hynix Inc., Icheon-si (KR)

(72) Inventor: Fu Hsiung Lin, Zhubei (TW)

(73) Assignee: SK hynix Inc., Icheon-si (KR)

( * ) Notice: Subject to any disclaimer, the term of this patent is extended or adjusted under 35 U.S.C. 154(b) by 113 days.

(21) Appl. No.: 17/869,429

(22) Filed: Jul. 20, 2022

(65) Prior Publication Data

US 2023/0377618 A1   Nov. 23, 2023

(30) Foreign Application Priority Data

May 19, 2022 (TW) .................................. 111118695

(51) Int. Cl.
G06F 13/16 (2006.01)
G11C 7/10 (2006.01)
G11C 7/22 (2006.01)

(52) U.S. Cl.
CPC .............. G11C 7/22 (2013.01); G11C 7/1063 (2013.01); G11C 7/1066 (2013.01)

(58) Field of Classification Search
CPC ........ G11C 7/22; G11C 7/1066; G11C 7/1063
See application file for complete search history.

(56) References Cited

U.S. PATENT DOCUMENTS

| | | | |
|---|---|---|---|
| 7,352,836 B1* | 4/2008 | Mendenhall | G06F 5/06 375/372 |
| 9,223,380 B2 | 12/2015 | Radulescu | |
| 9,952,791 B2 | 4/2018 | Jang et al. | |
| 10,528,410 B2 | 1/2020 | Hamo | |
| 10,572,427 B2 | 2/2020 | Rosensprung et al. | |
| 2007/0038782 A1* | 2/2007 | Jones | G06F 13/4059 709/250 |
| 2007/0288874 A1* | 12/2007 | Czeck | G06F 30/30 716/108 |
| 2010/0195835 A1* | 8/2010 | Nociolo | H04L 7/00 380/287 |
| 2015/0312006 A1 | 10/2015 | Goulahsen et al. | |
| 2016/0344638 A1 | 11/2016 | Schneider et al. | |
| 2018/0024962 A1 | 1/2018 | Lee et al. | |
| 2020/0341825 A1 | 10/2020 | Sudarmani et al. | |
| 2023/0186142 A1* | 6/2023 | Mladenov | G06F 1/10 257/31 |

* cited by examiner

Primary Examiner — Min Huang
(74) Attorney, Agent, or Firm — WILLIAM PARK & ASSOCIATES LTD.

(57) ABSTRACT

A synchronization circuit for an interconnection protocol, a controller and a storage device are provided. The synchronization circuit includes a first synchronization circuit module and a second synchronization circuit module. The first synchronization circuit module converts first control information of a first clock domain output by a data link layer receiver of the first device into second control information of a second clock domain, and outputs the second control information of the second clock domain. The second synchronization circuit module is coupled to the first synchronization circuit module, and converts the second control information of the second clock domain output by the first synchronization circuit module into third control information of a third clock domain to be output to a data link layer transmitter of the first device. Any two among the first, second and third clock domains are asynchronous.

20 Claims, 11 Drawing Sheets

| 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| 1 | ESC_DL ||||||| SOF ||||| TC || Reserved |||
| 0 | L2 Payload ||||||||||||||||
| 0 | ... ||||||||||||||||
| 0 | ESC_DL ||||||| EOF_EVEN ||||| Frame sequence number ||||
| 1 | CRC-16 ||||||||||||||||
| 0 | ||||||||||||||||

FIG. 4A

| 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| | 1 | | ESC_DL | | | | | | SOF | | | TC | | Reserved | | |
| | 0 | | L2 Payload | | | | | | | | | | | | | |
| | 0 | | ... | | | | | | | | | | | | | |
| | 0 | | L2 Payload | | | | | | | | | | | | | |
| | 1 | | ESC_DL | | | | | | 0X00 | | | EOF_ODD | | Frame sequence number | | |
| | 0 | | CRC-16 | | | | | | | | | | | | | |

FIG. 4B

| 16 | 15 | 14 | 13 | 12 | 11 | 10 | 9 | 8 | 7 | 6 | 5 | 4 | 3 | 2 | 1 | 0 |
|----|----|----|----|----|----|----|---|---|---|---|---|---|---|---|---|---|
| 1 | ESC_DL | | | | | | | Reserved | | AFC | | | TC | | CReq | Reserved |
| 0 | Frame sequence number | | | | | | | | Credit value | | | | | | | |
| 0 | CRC-16 | | | | | | | | | | | | | | | |

FIG. 4C

CIRCUIT FOR SYNCHRONIZATION FOR AN INTERCONNECTION PROTOCOL, CONTROLLER AND STORAGE DEVICE

CROSS-REFERENCE TO RELATED APPLICATION

The present application claims priority under 35 U.S.C. § 119(a) to Taiwanese Patent Application No. 111118695 filed on May 19, 2022, in the Taiwan Intellectual Property Office, which is incorporated herein by reference in its entirety.

BACKGROUND OF THE INVENTION

1. Field of the Invention

The present disclosure relates to an electronic device, and in particular to a synchronization circuit for an interconnection protocol, a controller and a storage device.

2. Description of the Related Art

As the amounts of data generated and processed in current mobile devices (for example, computing devices such as smartphones, tablet computers, multimedia devices and wearable devices) are continually increasing, technologies for chip-to-chip interconnection interface inside the mobile devices or interconnection interface affected by the mobile devices need to evolve further, so as to achieve goals such as higher transmission speed, low power consumption operation, expandability, support for multi-tasking and ease of adoption.

Hence, the Mobile Industry Processor Interface (MIPI) Alliance has developed an interconnection interface technology that meets the goals above, for example, the MIPI M-PHY specification for a physical layer and the MIPI UniPro specification for the Unified Protocol (UniPro). On the other hand, the Joint Electron Device Engineering Council (JEDEC), using the MIPI M-PHY specification and the MIPI UniPro specification, has launched a next-generation high-performance non-volatile memory standard that is referred to as Universal Flash Storage (UFS). The UFS realizes high-speed transmission in the order of Gbps and low-power operation, and provides the functionality and expandability required for advanced mobile systems to facilitate rapid adoption by the industry.

When products developed based on these interconnection interface technologies are related chips, electronic modules or electronic devices, it is necessary for technicians to ensure that the functions and operations of the products can meet the specifications. For example, a system that is implemented according to the UFS standard includes, for example, a computing device and a storage device implemented by a non-volatile memory, wherein the computing device and the storage device respectively serve as a local host and a remote device. A bidirectional link is established between the host and the device, and this link in between can be configured with multiple (at a maximum of four) lanes in either of the transmission directions. Correspondingly, each of the host and the device is configured with a processing circuit that is capable of processing the multiple lanes according to the interconnection protocol of the UniPro specification.

According to the UniPro specification, link-level flow control needs to be implemented in a data link layer. The data link layer flow control ensures that a transmitter of the data link layer at a transmitting end of the link stays aware of the capacity of an available buffer space at a data link layer at a receiving end of the link, so as to prevent buffer overflow of the data link layer and hence preventing from data loss. By using a credit-based flow control mechanism, a receiver of the data link layer at the receiving end sends credit information through the mechanism to update the credit information maintained by a transmitter of the data link layer at the transmitting end. How the data link layer at the transmitting end correctly and efficiently implements transmission of control information between the receiver and the transmitter of the data link layer to thereby effectively realize the credit-based flow control mechanism is a technical task that needs much attention in the aspect of implementation of the data link layer.

BRIEF SUMMARY OF THE INVENTION

Embodiments of a technique of a synchronization circuit for an interconnection protocol are provided, and the technique is suitable for use in a first device capable of linking a second device according to the interconnection protocol. During a communication process of the first device and the second device through the interconnection protocol, the technique is capable of synchronously transmitting, under the interconnection protocol, control information in a correct and efficient manner between a receiver and a transmitter of a data link layer of the first device, thereby facilitating effective realization of a credit-based flow control mechanism under the interconnection protocol.

Various embodiments are provided below according to the technique, for example, a synchronization circuit for an interconnection protocol, a controller and a storage device.

A synchronization circuit for an interconnection protocol is provided according to an embodiment, and is suitable for use in a first device capable of linking a second device according to the interconnection protocol. The synchronization circuit includes a first synchronization circuit module and a second synchronization circuit module. The first synchronization circuit module converts first control information of a first clock domain output by a data link layer receiver of the first device into second control information of a second clock domain, and outputs the second control information of the second clock domain. The second synchronization circuit module is coupled to the first synchronization circuit module, and converts the second control information of the second clock domain output by the first synchronization circuit module into third control information of a third clock domain to be output to a data link layer transmitter of the first device. The first control information output by the data link layer receiver is at least one signal of the first clock domain, the third control information output by the second synchronization circuit module is at least one signal of the third clock domain, and any two among the first clock domain, the second clock domain, and the third clock domain are asynchronous.

A controller is provided according to an embodiment. The controller is suitable for use in a first device capable of linking a second device according to an interconnection protocol, and includes a control module. The controller module is coupled to an interface circuit, and is for implementing a link layer of the interconnection protocol. The controller module includes a data link layer receiver, a data link layer transmitter and a synchronization circuit. The synchronization circuit is coupled between the data link layer receiver and the data link layer transmitter. The synchronization circuit includes a first synchronization circuit module and a second synchronization circuit module. The first synchronization circuit module converts first control information of a first clock domain output by the data link layer receiver into second control information of a second clock domain, and outputs the second control information of the second clock domain. The second synchronization circuit module is coupled to the first synchronization circuit module, and converts the second control information of the second clock domain output by the first synchronization circuit module into third control information of a third clock domain to be output to the data link layer transmitter. The first control information output by the data link layer receiver is at least one signal of the first clock domain, the third control information output by the second synchronization circuit module is at least one signal of the third clock domain, and any two among the first clock domain, the second clock domain, and the third clock domain are asynchronous.

A storage device is provided according to an embodiment. The storage device is capable of linking a host according to an interconnection protocol, and includes a storage module, an interface circuit, and a controller module. The interface circuit is for implementing a physical layer of the interconnection protocol to link the host. The controller module is coupled to the interface circuit and the storage module, and is for implementing a link layer of the interconnection protocol. The controller module includes a data link layer receiver, a data link layer transmitter, and a synchronization circuit. The synchronization circuit is coupled between the data link layer receiver and the data link layer transmitter. The synchronization circuit includes a first synchronization circuit module and a second synchronization circuit module. The first synchronization circuit module converts first control information of a first clock domain output by the data link layer receiver into second control information of a second clock domain, and outputs the second control information of the second clock domain. The second synchronization circuit module is coupled to the first synchronization circuit module, and converts the second control information of the second clock domain output by the first synchronization circuit module into third control information of a third clock domain to be output to the data link layer transmitter. The first control information output by the data link layer receiver is at least one signal of the first clock domain, the third control information output by the second synchronization circuit module is at least one signal of the third clock domain, and any two among the first clock domain, the second clock domain, and the third clock domain are asynchronous.

In some embodiments of the synchronization circuit, the controller, or the storage device above, when a frame receiving processing unit of the data link layer receiver completes processing of a data frame and successfully transmits the data frame to an upper layer, the first control information of the first clock domain output by the frame receiving processing unit is converted into the third control information of the third clock domain through the first synchronization circuit module and the second synchronization circuit module of the synchronization circuit so as to output the third control information of the third clock domain to the data link layer transmitter.

In some embodiments of the synchronization circuit, the controller, or the storage device above, after a frame receiving processing unit of the data link layer receiver correctly receives a control frame, the first control information of the first clock domain output by the data link layer receiver is converted into the third control information of the third clock domain through the first synchronization circuit module and the second synchronization circuit module of the synchronization circuit so as to output the third control information of the third clock domain to the data link layer transmitter.

In some embodiments of the synchronization circuit, the controller, or the storage device above, the synchronization circuit further includes a third synchronization circuit module and a fourth synchronization circuit module. The third synchronization circuit module converts fourth control information of the third clock domain output by the data link layer transmitter into fifth control information of the second clock domain, and outputs the fifth control information of the second clock domain. The fourth synchronization circuit module is coupled to the third synchronization circuit module, and converts the fifth control information of the second clock domain output by the third synchronization circuit module into sixth control information of the first clock domain to be output to the data link layer receiver. The fourth control information output by the data link layer transmitter is at least another signal of the third clock domain, and the sixth control information output by the fourth synchronization circuit module is at least another signal of the first clock domain.

In some embodiments of the synchronization circuit, the controller, or the storage device above, after the data link layer transmitter completes sending a data frame, the fourth control information of the third clock domain output by the data link layer transmitter is converted into the sixth control information of the first clock domain through the third synchronization circuit module and the fourth synchronization circuit module of the synchronization circuit so as to output the sixth control information of the first clock domain to the data link layer receiver.

In some embodiments, the synchronization circuit module can be implemented to synchronize control information under conditions of difference trigger and multi-phase latch.

In some embodiments of the synchronization circuit, the controller, or the storage device above, the first synchronization circuit module is configured to perform information exchange only when the first control information output by the data link layer receiver is different from previous control information.

In some embodiments of the synchronization circuit, the controller, or the storage device above, the first synchronization circuit module is configured to, while performing the information exchange, latch the first control information in the first clock domain, and then latch the first control information in the second clock domain after a first number of cycles of the first clock domain and a second number of cycles of the second clock domain, and output the first control information latched in the second clock domain as the second control information.

In some embodiments of the synchronization circuit, the controller, or the storage device above, the first synchronization circuit module is configured for performing the information exchange with the first number equal to or greater than the second number.

In some embodiments of the synchronization circuit, the controller, or the storage device above, at least one of or all of the second synchronization circuit module, the third synchronization circuit module, and the fourth synchronization circuit module can be configured in an arrangement similar to that of the first synchronization circuit module.

In some embodiments of the synchronization circuit, the controller, or the storage device above, the interconnection protocol is a Universal Flash Storage (UFS) standard.

BRIEF DESCRIPTION OF THE DRAWINGS

FIG. 4A is a schematic diagram of a format of a data frame of a data link layer according to the UniPro specification.

FIG. 4B is a schematic diagram of a format of a data frame of a data link layer according to the UniPro specification.

FIG. 4C is a schematic diagram of a format of a control frame of a data link layer according to the UniPro specification.

DETAILED DESCRIPTION OF THE INVENTION

To facilitate understanding of the objects, characteristics and effects of this present disclosure, embodiments together with the attached drawings for the detailed description of the present disclosure are provided below.

A technique of a synchronization circuit for an interconnection protocol is provided according to the embodiments below, and is suitable for use in a first device capable of linking a second device according to the interconnection protocol. The technique realizes, based on a synchronization circuit module, a data link layer synchronization circuit between a receiver and a transmitter of a data link layer. The data link layer synchronization circuit uses a synchronization circuit module to convert control information output by the receiver from a first clock domain into a second clock domain, and uses another synchronization circuit module to convert from the second clock domain into a third clock domain, thereby sending the control information to the transmitter. With this technique, the control information can be correctly and efficiently transmitted between the receiver and the transmitter of the data link layer, thereby facilitating effective realization of a credit-based flow control mechanism for the data link layer. Various implementation approaches according to the technique are described in the examples below.

Figure 1:
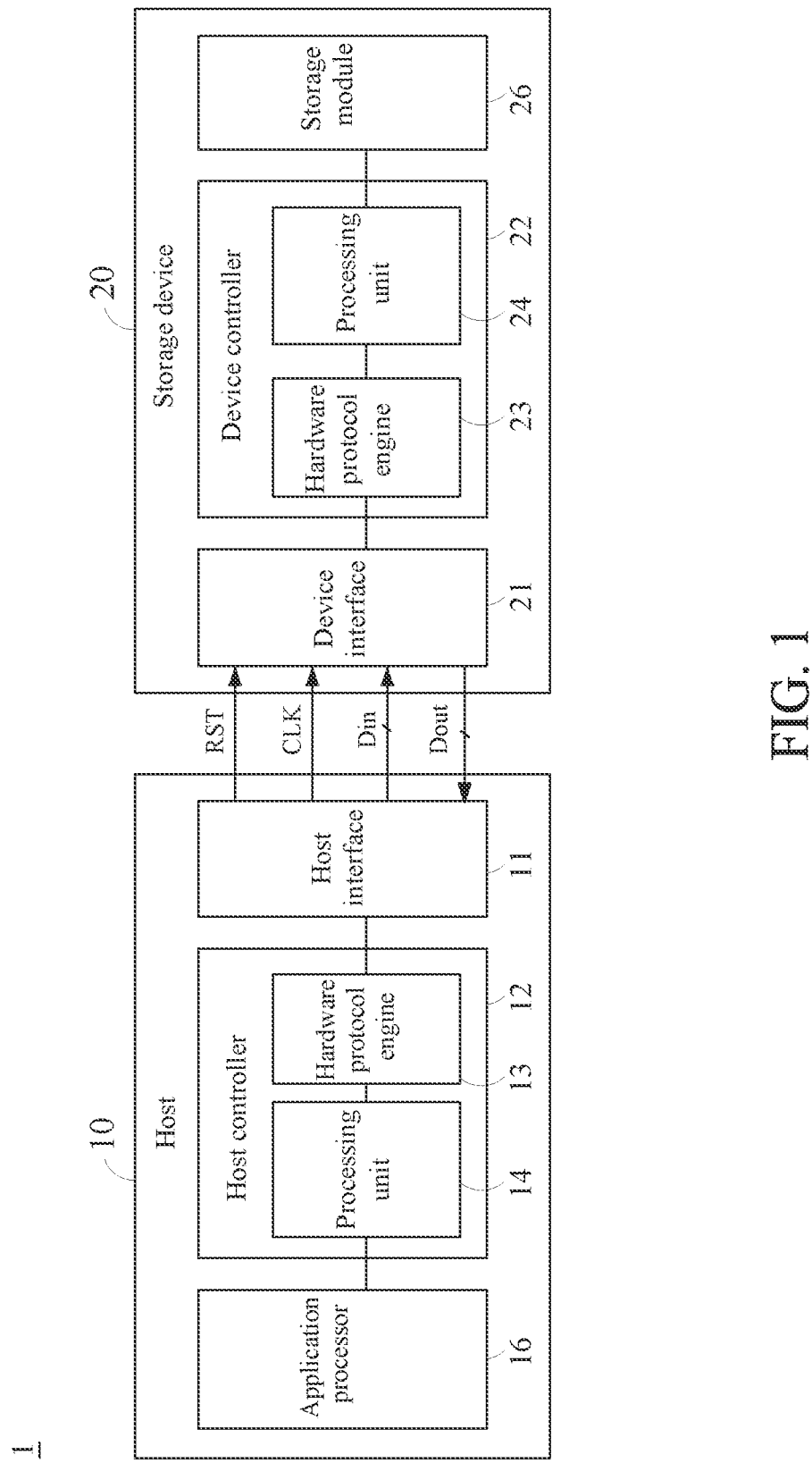
FIG. 1 is a schematic block diagram of a storage system according to an embodiment.

To better understand and illustrate the various implementation approaches according to the technique, circuit architecture for an interconnection protocol-based communication system is provided. This circuit architecture has sufficient flexibility and can be efficiently configured to meet requirements of different products, so as to adapt to diversified designs of manufacturers for better product development. The technique is applicable to a first device (for example, a storage device 20 in FIG. 1) capable of linking a second device (for example, a host 10 in FIG. 1) according to the interconnection protocol, and is also suitable for use in a situation where the first device is the host 10 and the second device is the storage device 20. As shown in FIG. 1, when this circuit architecture is applied to a storage system 1, a controller module (for example, a host controller 12) of the host 10 of the storage system 1 or a controller module (for example, a device controller 22) of the storage device 20 of the storage system 1 can be implemented as circuit architecture including a hardware protocol engine and a processing unit, wherein the processing unit of the controller is optional. For another example, a controller, such as a single chip, for the host 10, can be made according to a combination of a host interface 11 and the host controller 12; in addition, a controller, such as a single chip, for the storage device 20, can be made according to a combination of a device interface 21 and the device controller 22.

Refer to FIG. 1, which shows a schematic block diagram of a storage system provided according to an embodiment of the present disclosure. As shown in FIG. 1, the storage system 1 includes the host 10 and the storage device 20. The host 10 and the storage device 20 communicate through an interconnection protocol in between, thereby allowing the host 10 to perform data access to the storage device 20. The interconnection protocol is, for example, the Universal Flash Storage (UFS) standard. The host 10 is, for example, a computing device such as a smartphone, a tablet computer, or a multimedia device. The storage device 20 is, for example, a storage device inside or outside the computing device, and is such as a storage device based on a non-volatile memory. The storage device 20 can be written with data under control of the host 10 or provide written data to the host 10. The storage device 20 can be implemented as solid-state drive (SSD), a multimedia card (MMC), an embedded Multimedia card (eMMC), a Secure Digital (SD) card, or a UFS device; however, the implementation of the present disclosure is not limited to the examples above.

The host 10 includes the host interface 11, the host controller 12, and an application processor 16.

The host interface 11 is for implementing a physical layer of the interconnection protocol so as to link the storage device 20. For example, the host interface 11 is for implementing a physical (M-PHY) layer of the UFS standard.

The host controller 12 is coupled between the host interface 11 and the application processor 16. When the application processor 16 needs to perform data access to the storage device 20, it sends a corresponding access operation command to the host controller 12 and communicates with the storage device 20 through the interconnection protocol, thereby completing data access to the storage device 20.

The host controller 12 includes, for example, a hardware protocol engine 13 and a processing unit 14, wherein the processing unit 14 is optional.

The hardware protocol engine 13 is for implementing a link layer of the interconnection protocol. Taking the UFS standard as the interconnection protocol for example, the link layer is a Unified Protocol (UniPro) layer. The hardware protocol engine 13 communicates with the host interface 11 and the processing unit 14 and performs data conversion according to the specification of the link layer.

The processing unit 14 is coupled to the hardware protocol engine 13, and communicates with the application processor 16. The processing unit 14 can execute one or more sets of firmware. For example, an access operation command sent by an operating system, a driver or an application executed by the application processor 16 is converted into a command format compliant to the link layer of the interconnection protocol by the firmware executed by the processing unit 14, and is then sent to the hardware protocol engine 13 for processing according to the specification of the link layer. The firmware can be stored, for example, in an internal memory of the processing unit 14, or be stored in an internal memory of the host controller 12, wherein the internal memory can include a volatile memory and a non-volatile memory.

The storage device 20 includes the device interface 21, the device controller 22, and a storage module 26.

The device interface 21 is for implementing a physical layer of the interconnection protocol to link the host 10. For example, the device interface 21 is for implementing a physical (M-PHY) layer of the UFS standard.

The device controller 22 is coupled between the device interface 21 and the storage module 26. The device controller 22 can control write, read or erase operations of the storage module 26. The device controller 22 can exchange data with the storage module 26 through an address bus or a data bus. The storage module 26 includes, for example, one or more non-volatile memory chip.

The device controller 22 includes a hardware protocol engine 23 and a processing unit 24, wherein the processing unit 24 is optional.

The hardware protocol engine 23 is for implementing a link layer of the interconnection protocol. Taking the UFS standard as the interconnection protocol for example, the link layer is a UniPro layer. The hardware protocol engine 23 communicates with the device interface 21 and the processing unit 24 and performs data conversion according to the specification of the link layer.

The processing unit 24 is coupled to the hardware protocol engine 23, and communicates with the host 10 through the device interface 21. The processing unit 24 can execute one or more sets of firmware. For example, the processing unit 24 performs one or more sets of firmware to control or give an instruction for a write operation, a read operation or an erase operation of the storage module 26, to process a message from the hardware protocol engine 23 or to send a message to the hardware protocol engine 23. The firmware can be stored, for example, in an internal memory of the processing unit 22, an internal memory of the device controller 22, or a predetermined storage region of the storage module 26, wherein the internal memory can include a volatile memory and a non-volatile memory.

As shown in FIG. 1, the host interface 11 can be coupled to the device interface 21 through data lines Din and Dout for transmitting/receiving data, a reset line RST for transmitting a hardware reset signal and a clock line CLK for transmitting data. The data lines Din and Dout can be implemented in multiple pairs, wherein one pair of data lines Din or one pair of data lines Dout can be referred to as a lane. The host interface 11 can communicate with the device interface 21 by using at least one interface protocol, which is, for example, the MIPI, UFS, Small Computer System Interface (SCSI) or Serial Attached SCSI (SAS); however, the implementation of the present disclosure is not limited to the examples above. Under the UFS standard, the host 10 and the storage device 20 can be configured with multiple lanes in between to enhance transmission efficiency, wherein either of the directions from the host 10 to the storage device 20 or from the storage device 20 to the host 10 can support two lanes at most, and the multiple lanes can be set to be active or inactive.

Details are given by taking the UFS standard as an example of the interconnection protocol. The UFS standard includes a UFS command set (USC) layer, a UFS transport (UTP) layer, and a UFS interconnect (UIC) layer. The UIC layer includes a link layer and a physical layer. The link layer of the UIC layer is defined according to the UniPro specification, and the physical layer of the UIC layer is defined according to the M-PHY specification.

Figure 2:
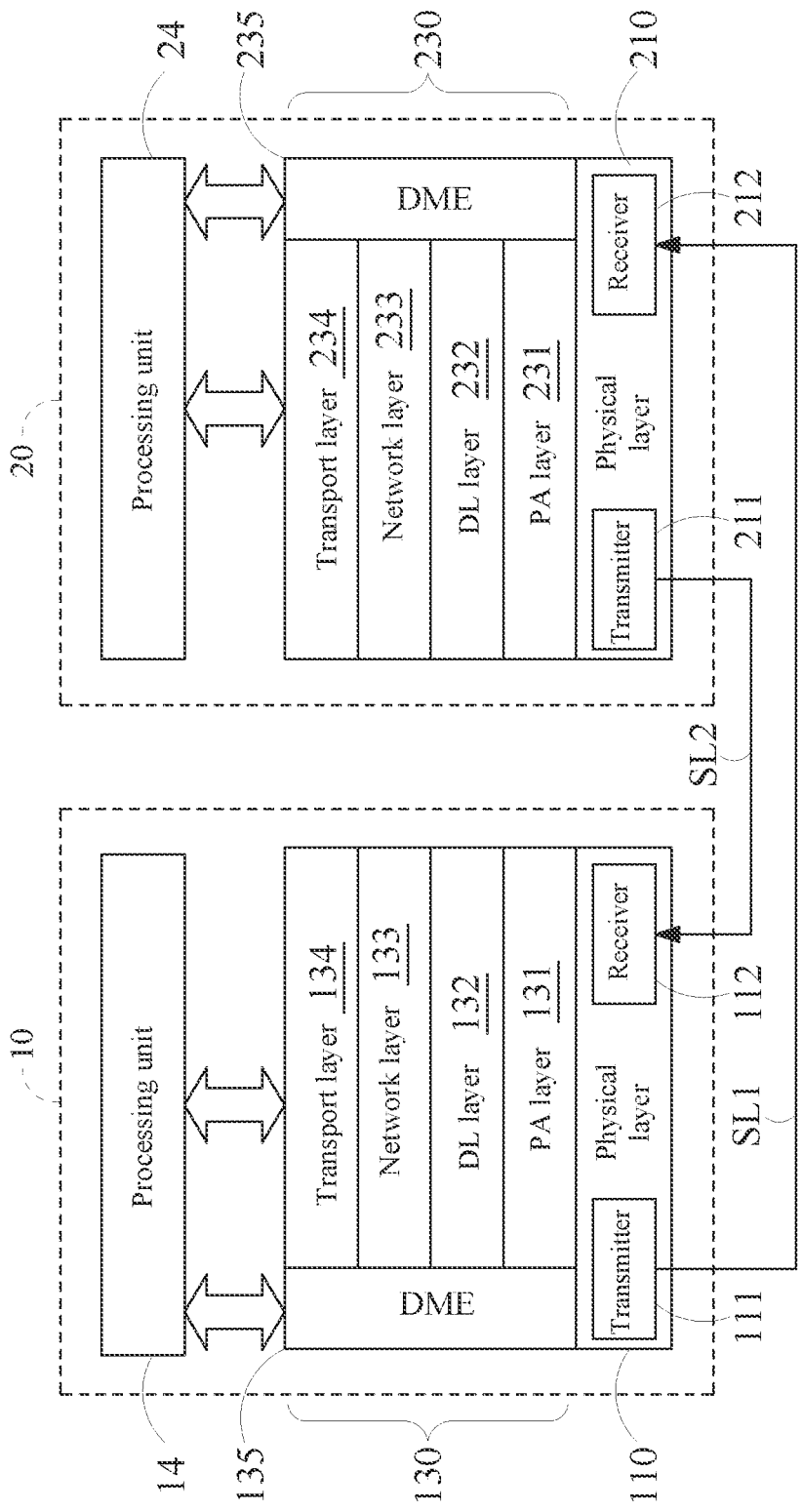
FIG. 2 is a schematic diagram of layered architecture of the storage system of FIG. 1 according to the UFS standard.

Refer to FIG. 2 showing a schematic diagram of layered architecture of the storage system of FIG. 1 according to the UFS standard. Because the UFS standard is based on the MIPI UniPro layer and the MIPI M-PHY layer, the host interface 11 and the hardware protocol engine 13 of the host 10 shown in FIG. 1 are respectively used to implement a physical layer 110 and a UniPro layer 130 in FIG. 2, and the device interface 21 and the hardware protocol engine 23 of the storage device 20 shown in FIG. 1 are respectively used to implement a physical layer 210 and a UniPro layer 230 in FIG. 2.

As shown in FIG. 2, the UniPro layer 130 (or 230) can include a PHY adapter (PA) layer 131 (or 231), a data link (DL) layer 132 (or 232), a network layer 133 (or 233), and a transport layer 134 (or 234). The layers in the UniPro layer 230 of the storage device 20 can also similarly operate and be implemented.

The PHY adapter layer (131 or 231) couples the physical layer (110 or 210) to the data link layer (132 or 232). The PHY adapter layer (131 or 231) is capable of performing bandwidth control and power management between the physical layer (110 or 210) and the data link layer (132 or 232). In implementation, the physical layer 110 of the host 10 includes a transmitter 110 and a receiver 112, and the physical layer 210 of the storage device 20 includes a transmitter 211 and a receiver 212, thereby establishing data lanes SL1 and SL2 to perform full duplex communication. The UniPro specification supports multiple data lanes for a link in each transmission direction (for example, forward or backward).

The data link layer (132 or 232) is capable of performing flow control of data transmission between the host 10 and the storage device 20. That is, the data link layer (132 or 232) can monitor data transmission or control a data transmission rate. Moreover, the data link layer (132 or 232) can perform cyclic redundancy check (CRC)-based error control. The data link layer (132 or 232) can use packets received from the network layer (133 or 233) to generate frames, or can use frames received from the PHY adapter layer (131 or 231) to generate packets.

The network layer (133 or 233) is used for routing function to select a transmission path for the packets received from the transport layer (134 or 234).

The transport layer (134 or 234) can use a command received from the UFS application layer to configure a segment suitable for the protocol and transmit the segment to the network layer (133 or 233), or can extract a command from packets received from the network layer (133 or 233) and transmit the command to the UFS application layer. The transport layer (134 or 234) can use a sequence-based error control scheme to ensure validity of data transmission.

Moreover, the UniPro layer (130 or 230) is further defined with a device management entity (DME) (135 or 235), which can communicate with the layers in the physical layer (110 or 210) and the UniPro layer (130 or 230), for example, the PHY adapter layer (131 or 231), the data link layer (132 or 232), the network layer (133 or 233) and the transport layer (134 or 234), so as to communicate with the UFS application layer, thereby implementing unified protocol (UniPro) overall functions such as control or configuration functions including power-on, power-off, reset and power mode change.

As described above, the UFS standard uses the UniPro specification to define multiple protocol layers in a link layer. In addition to defining the functions of the protocol layers, the UniPro specification defines conceptual interfaces referred to as service access points (SAPs) among the protocol layers to perform communication, wherein each protocol layer has multiple corresponding SAPs to allow an upper layer or a lower layer to use services provided by the protocol layer. Under requirements to be compliant to the UniPro specification, a research and development unit or manufacturer can use respective technical solutions to substantially implement the protocol layers and the SAPs by way of hardware, firmware, software or a combination thereof.

Figure 3:
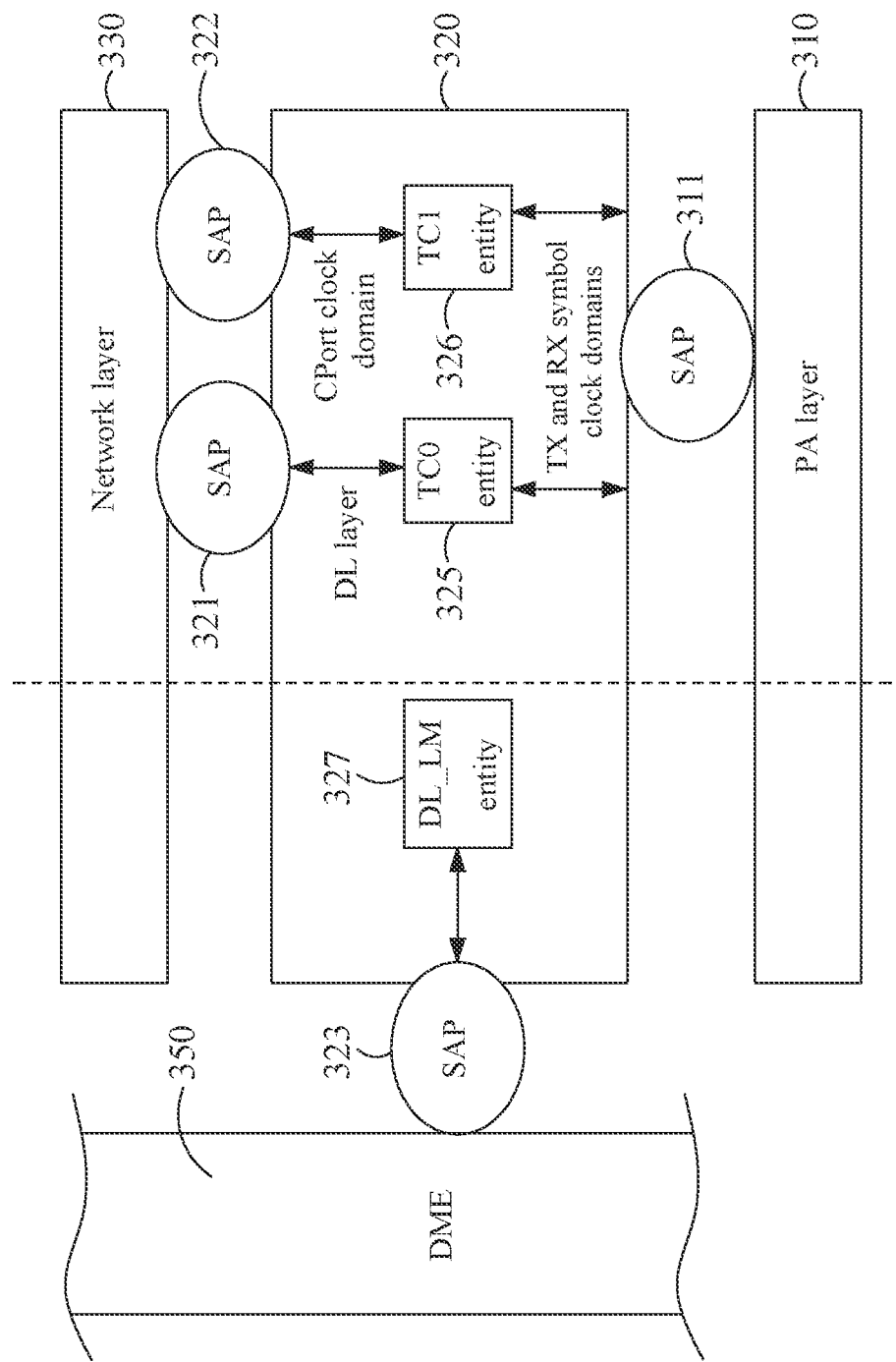
FIG. 3 is a schematic diagram of a service access point model of a data link layer according to the UniPro specification.

Refer to FIG. 3 showing a schematic diagram of SAP model of a data link layer according to the UniPro specification. As shown in FIG. 3, a data link layer 320 (representing 132 or 232 in FIG. 2) has two traffic class-specific SAPs 321 and 322. The SAPs 321 and 322 are service access points, for example, SAP DL_TC0_SAP and DL_TC1_SAP defined in the UniPro specification, for providing data link layer services for a traffic class 0 and a traffic class 1 to a network layer 330 (representing 133 or 233 in FIG. 2), respectively. Moreover, the data link layer 320 has an SAP 323, for example, an SAP DL_LM_SAP defined in the UniPro specification, which is provided to a device management entity 350 (for example, 135 or 235 in FIG. 2) for configuration and control purposes. In addition, the data link layer 320 relies on services provided to the data link layer 320 by an SAP 311 (denoted as PA_SAP in the UniPro specification) of a PHY adapter layer 310 (for example, 131 or 231 in FIG. 2). As shown in FIG. 3, a TC0 entity 325, a TC1 entity 326, and a DL_LM entity 327 of the data link layer 320 represent entities providing services represented by the SAPs 321, 322, and 323, respectively, and each of the entities can be implemented by way of hardware, software or a combination of software and hardware according to the UniPro specification.

The UFS system supports two traffic classes in the data link layer. The two traffic classes are respectively referred to as a traffic class 0 (denoted as TC0) and a traffic class 1 (denoted as TC1), wherein data frames of the traffic class 1 have a higher priority in terms of transmission over data frames of the traffic class 0. According to the UniPro specification, the data link layer provides multiple services so as to ensure that data of a service user (that is, a layer using the service) is transparently and reliably transmitted through the SAPs DL_TC0_SAP or DL_TC1_SAP. As shown in FIG. 3, the SAPs 321 and 322 are respectively suitable for the traffic class 0 (TC0) or the traffic class 1 (TC1), so as to transmit data of a service user in a receiving direction (DL RX) between the data link layer 320 and the network layer 330.

According to the UniPro specification, the data link layer converts multiple 17-bit PA layer protocol data units (PDU) symbols into DL layer protocol data units (that is, data frames). For example, each data frame includes a series of 17-bit symbols encoded as data symbols or control symbols. Refer to FIG. 4A and FIG. 4B showing schematic diagrams of a format of a data frame of a data link layer according to the UniPro specification. For a 17-bit symbol, a most significant bit (MSB) in 0 indicates that the symbol is a data symbol, and an MSB in 1 indicates that the symbol is a data control symbol. Only 16-bit symbol, excluding the MSB, is transmitted through a link. In brief, each valid symbol is 16-bit service user data, and is transmitted to an upper layer (in terms of a receiving direction) or a lower layer (in terms of a transmitting direction).

In the data link layer, all traffic classes use data frames of the same format. As shown in FIG. 4A and FIG. 4B, each data frame includes a header of one symbol, a payload of at least one symbol and a trailer of two symbols, wherein the trailer includes a checksum (for example, a 16-bit CRC-code (CRC-16)). In addition, each data frame always starts with a start of frame (SOF) symbol, and ends with an end of frame (EOF) symbol, that is, an EOF_EVEN symbol or an EOF_ODD symbol. The EOF_EVEN symbol and the EOF_ODD symbol are followed by one CRC symbol. Moreover, the header includes a traffic class (TC) label, for example, TC0 or TC1 to represent the level of priority in addition to the SOF. Moreover, the trailer includes a frame sequence number in addition to the EOF. An ESC_DL label indicates that this frame is a frame of the data link layer.

Refer to FIG. 4C showing a schematic diagram of a format of a control frame of a data link layer according to the UniPro specification. The control frame shown in FIG. 4C is an acknowledgement and flow control (AFC) frame of the data link layer, and is used to acknowledge that a data frame is correctly received and is used to exchange flow control information of the corresponding traffic classes. The AFC frame starts with an AFC control symbol, followed by two data symbols. The AFC frame includes a traffic class (TC) identifier, a credit transmit request (CReq) bit, a frame sequence number and a flow control credit value. The acknowledgement (frame sequence number) and flow control (credit value) information are assigned to the traffic class identified by the TC field.

The UniPro specification has specified the operation of a service access point model for TC0 or TC1 of the data link layer receiver (or referred to as DL RX for short). In general, each process of data transmission to a data link layer is based on frames, and if represented by a denotation, the frame can be represented as: "SOF+TC0 Data #0+EOF+CRC", "SOF+ TC0 Data #1+EOF+CRC", and the like. The data link layer receiver removes the header (the SOF symbol) and trailer (such as the EOF_EVEN or EOF_ODD symbol and CRC symbol) of the frame, and transmits user data to an upper layer after the CRC check is correct.

According to the data link layer flow control of the UniPro specification, in a scenario where a local end receives the TC0 data frame, when an upper layer at the local end correctly receives each TC0 data frame, the sequence number and the credit value "A" defined in the UniPro specification need to be updated in the DL RX. The control information including the acknowledged sequence number and credit value "A" is provided to a data link layer transmitter (or referred to as DL TX for short) so as to transmit an AFC0 control frame to a peer side (which can also be referred to as a remote end herein). Then, a credit value "S" is replaced by "A" at the peer side.

According to the data link layer flow control of the UniPro specification, in a scenario where a local end receives the AFC0 control frame, when the DL RX at the local end correctly receives each AFC0 control frame, the sequence number and the credit value "R" in the AFC0 control frame received need to be updated in the DL RX. This control information is provided to allow the DL TX to release an acknowledged TC0 transmitter (TX) buffer region and the DL TX can start transmitting the next data frame having a new sequence number to the peer side (or the remote end). Then, after the DL TX transmits the data frame to the PHY adapter (PA) layer, the DL TX updates the credit value "U" defined in the UniPro specification.

Moreover, according to the UniPro specification, in a scenario where the local end receives the AFC0 control frame, when it is learned at the local end from the credit value in the control information of the AFC0 control frame received that a receiver (RX) buffer region of the peer side (or the remote end) is available, the DL TX transmits the data frame to the PA layer. After the DL TX completes transmitting the TC0 data frame, the sequence number is updated so as to notify the DL RX of the sequence number of the AFC0 control frame that is expected to be received next.

From the perspective of the above operations of data link layer flow control specified by the UniPro specification, the following technical issues are observed by the inventor of the present disclosure.

(1) The DL TX and the DL RX need to exchange information in between, for example, acknowledgement (frame serial number) and flow control (credit value) information, which is multi-bit bus information. Moreover, the credit value in the multi-bit information does not simply change in a manner of an increment of one.

(2) It is seen from the schematic diagram of FIG. 3, when the data link layer 320 is implemented by hardware, data link layer circuits adjacent to or associated with an upper layer operate in a clock domain of the upper layer, for example, in a CPort clock domain, and the data link layer circuits adjacent to or associated with a lower layer operate in a clock domain of the lower layer, for example, in a TX symbol clock domain and an RX symbol clock domain. Moreover, the clock domains in which the DL TX and the DL RX of the data link layer 320 operate are asynchronous. Thus, in the data link layer 320, any two among the CPort, DL TX and DL RX are asynchronous.

(3) In the UniPro specification, the RX symbol clock can be turned off after a predetermined number of RX trailing clock cycles, for example, being set by a PA layer minimum RX trailing clock cycle attribute (PA_MinRxTrailing-Clocks) defined in the UniPro specification. This is a special circumstance of circuit operations of the data link layer of the UniPro specification.

Regarding the technical issues above, although multi-bit synchronization can be performed by using some conventional synchronizer solutions, there are still problems. For example, a FIFO-based synchronizer solution may be reliable, but require a larger number of logic gates and consume a considerable amount of power. In addition, a solution of a bidirectional handshake synchronizer may have more latency, and cause problems when a source clock becomes off (as in the case of the RX symbol clock being off above).

Therefore, the inventor provides the following implementation of a data link layer synchronization circuit in view of the above technical issues so that "control information" can be correctly exchanged without incurring any meta problem and power consumption can be reduced. The data link layer synchronization circuit can be further configured to quickly exchange control information before a source clock (for example, the RX symbol clock) is turned off. The "control information" may include acknowledgement information (for example, the frame sequence number), or flow control information (for example, the credit value) or both of the above.

Figure 5:
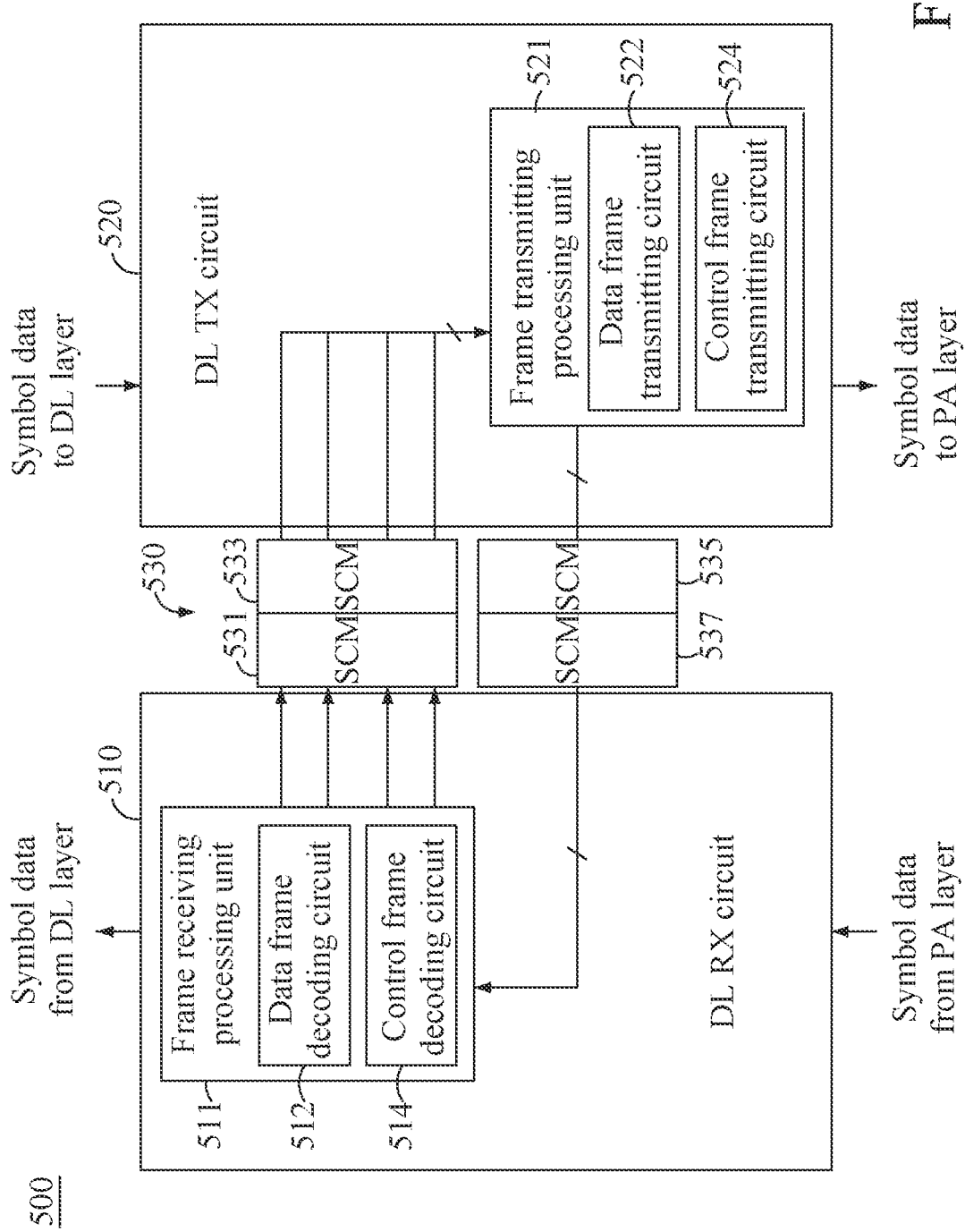
FIG. 5 is a schematic diagram of circuit architecture for various embodiments of a data link layer synchronization circuit.

Refer to FIG. 5 showing a schematic diagram of circuit architecture of various embodiments of a data link layer synchronization circuit, which can represent a plurality of embodiments based on FIG. 5. The circuit architecture shown in FIG. 5 can be applied to the implementation of a host controller (12) of a host or a device controller (22) of a storage device, for example, the implementation of a data link layer (132 or 232, or 320) in a hardware protocol engine of the host or the storage device.

Under the UniPro specification, a data link layer receiver (DL RX) and a data link layer transmitter (DL TX) in a data link layer (132 or 232; or 320) can be implemented according to the circuit architecture in FIG. 5. As shown in FIG. 5, a data link layer circuit 500 includes a data link layer receiver (DL RX) circuit 510, a data link layer transmitter (DL TX) circuit 520 and a data link layer synchronization circuit 530. The data link layer receiver (DL RX) circuit 510 and the data link layer transmitter (DL TX) circuit 520 can be implemented to operate in two clock domains denoted as, for example, TD_RX and TD_TX, and the two clock domains can be clock domains of different frequencies or asynchronous clock domains, for example, representing the foregoing RX and TX symbol clock domains, respectively.

The data link layer synchronization circuit 530 is used for synchronous transmission of control information between the data link layer receiver (DL RX) circuit 510 and the data link layer transmitter (DL TX) circuit 520. The data link layer synchronization circuit 530 can include multiple synchronization circuit modules (SCMs), which can be individually configured so as to satisfy the purpose of synchronous transmission of control information under the UniPro specification.

In one embodiment based on FIG. 5, the data link layer synchronization circuit 530 can be configured to synchronously transmit control information output by the data link layer receiver (DL RX) circuit 510 to the data link layer transmitter (DL TX) circuit 520. In this embodiment, the data link layer synchronization circuit 530 includes synchronization circuit modules 531 and 533. The synchronization circuit module 531 converts first control information (for example, a sequence number and a credit value) of a first clock domain (for example, TD_RX) output by the data link layer receiver (DL RX) circuit 510 into second control information of a second clock domain (for example, the CPort clock domain, denoted as TD_CP), and outputs the second control information of the second clock domain. The synchronization circuit module 533 converts the second control information of the second clock domain (for example, TD_CP) output by the synchronization circuit module 531 into third control information of a third clock domain (for example, TD_TX), and outputs the third control information of the third clock domain to the data link layer transmitter (DL TX) circuit 520. Thus, the data link layer synchronization circuit 530 can be used for receiver-to-transmitter synchronous transmission of control information. In the description above, to differentiate the control information of different clock domains, the control information is respectively named as the first control information, the second control information and the third control information.

The embodiment of the data link layer synchronization circuit 530 is used for receiver-to-transmitter synchronous transmission of control information, and is capable of implementing data link layer flow control in the UniPro specification above. Thus, when a data link layer receiver (DL RX) and a data link layer transmitter (DL TX) are implemented according to the UniPro specification, a frame receiving processing unit 511 can be implemented in the data link layer receiver (DL RX) circuit 510 to output control information or receive control information, and a frame transmitting processing unit 521 can be implemented in the data link layer transmitter (DL TX) circuit 520 to receive corresponding control information or output corresponding control information, according to the circuit architecture in FIG. 5.

In one example, the frame receiving processing unit 511 includes a data frame decoding circuit 512, which is used to decode symbols that belong to the TC0 data frame in the symbol data from the PA layer. For implementation of a scenario where the local end receives the TC0 data frame in the data link layer flow control of the UniPro specification above, the data link layer receiver (DL RX) circuit 510, the data link layer transmitter (DL TX) circuit 520, and the data link layer synchronization circuit 530 can be further configured as below. For example, when the data link layer receiver (DL RX) circuit 510 completes processing of one TC0 data frame such as processing by the frame receiving processing unit 511 or the data frame decoding circuit 512 and successfully transmits the data frame to an upper layer (for example, a network layer), that is, when the upper layer correctly receives the TC0 data frame, the data link layer receiver (DL RX) circuit 510 updates the sequence number and the credit value "A" defined in the UniPro specification, and provides control information including the acknowledged sequence number and credit value "A" to the frame transmitting processing unit 521 of the data link layer transmitter (DL TX) circuit 520 through the above receiver-to-transmitter synchronous transmission of control information by the data link layer synchronization circuit 530. A control frame transmitting circuit 524 of the frame transmitting processing unit 521 generates an AFC0 control frame that is to be transmitted to a peer side according to the control information provided by the above synchronous transmission of control information.

In another example, the frame receiving processing unit 511 can further include a control frame decoding circuit 514, which is used to decode symbols that belong to the AFC0 control frame in the symbol data from the PA layer. For implementation of a scenario where the local end receives the AFC0 control frame in the data link layer flow control of the UniPro specification above, the data link layer receiver (DL RX) circuit 510, the data link layer transmitter (DL TX) circuit 520, and the data link layer synchronization circuit 530 can be further configured as below. For example, when the frame receiving processing unit 511 or the control frame decoding circuit 514 of the data link layer receiver (DL RX) circuit 510 correctly receives an AFC0 control frame, the data link layer receiver (DL RX) circuit 510 needs to update the sequence number received and the credit value "R" in the AFC0 control frame. The data link layer receiver (DL RX) circuit 510 provides the control information to the frame transmitting processing unit 521 of the data link layer transmitter (DL TX) circuit 520 through the above receiver-to-transmitter synchronous transmission of control information by the data link layer synchronization circuit 530 so as to allow the data link layer transmitter (DL TX) circuit 520 to release an acknowledged TC0 transmitter (TX) buffer region, and the data link layer transmitter (DL TX) circuit 520 can start transmitting the next data frame having the new sequence number to the peer side (or referred to as a remote end). Then, after the frame transmitting processing unit 521 of the data link layer transmitter (DL TX) circuit 520 transmits the data frame to the PHY adapter (PA) layer, the data link layer transmitter (DL TX) circuit 520 updates the credit value "U" defined by the UniPro specification.

In another embodiment based on FIG. 5, the data link layer synchronization circuit 530 can be configured to synchronously transmit control information output by the data link layer transmitter (DL TX) circuit 520 to the data link layer receiver (DL RX) circuit 510. In this embodiment, the data link layer synchronization circuit 530 can include synchronization circuit modules 535 and 537. The synchronization circuit module 535 converts fourth control information (for example, a sequence number) of the third clock domain (for example, TD_TX) output by the data link layer transmitter (DL TX) circuit 520 into fifth control information of the second clock domain (for example, TD_CP), and outputs the fifth control information of the second clock domain. The synchronization circuit module 537 converts the fifth control information of the second clock domain (for example, TD_CP) output by the synchronization circuit module 535 into sixth control information of the first clock domain (for example, TD_RX), and outputs the sixth control information of the first clock domain (for example, TD_RX) to the data link layer receiver (DL RX) circuit 510. Thus, the data link layer synchronization circuit 530 can be used for transmitter-to-receiver synchronous transmission of control information. In the description above, to differentiate the control information of different clock domains, the control information is respectively named as the fourth control information, the fifth control information, and the sixth control information.

In one example, the frame transmitting processing unit 521 can include a data frame transmitting circuit 522 and a control frame transmitting circuit 524. The data frame transmitting circuit 522 is used to perform data frame transmitting processing according to the UniPro specification, and the control frame transmitting circuit 524 is used to perform control frame transmitting processing according to the UniPro specification. For implementation of a scenario where the local end receives the AFC0 control frame in the data link layer flow control of the UniPro specification above, the data link layer receiver (DL RX) circuit 510, the data link layer transmitter (DL TX) circuit 520 and the data link layer synchronization circuit 530 can be configured as below. When the data link layer transmitter (DL TX) circuit 520 learns from the credit value in the control information of the AFC0 control frame received that a receiver (RX) buffer region of a peer side (or referred to as a remote end) is available, the data frame transmitting circuit 522 of the data link layer transmitter (DL TX) circuit 520 transmits a data frame to the PA layer. After the data link layer transmitter (DL TX) circuit 520 completes transmitting the TC0 data frame, the control information with an updated sequence number is transmitted through transmitter-to-receiver synchronous transmission of control information by the data link layer synchronization circuit 530, so as to notify the data link layer receiver (DL RX) circuit 510 of the sequence number of the AFC0 control frame that is expected to be received next.

From the above embodiments based on the circuit architecture in FIG. 5, the processes of the receiver-to-transmitter synchronous transmission of control information and transmitter-to-receiver synchronous transmission of control information by the synchronization circuit 530 both adopt the second clock domain as a relay clock domain, wherein the second clock domain is independent from the first clock domain of the data link layer receiver (DL RX) circuit 510 and the third clock domain of the data link layer transmitter (DL TX). In some embodiments, where the foregoing technical issues (3) is applicable, when clock signals of the first clock domain or the third clock domain are turned off after a predetermined number of trailing clock cycles according to the UniPro specification, since the second clock domain of the synchronization circuit 530 is independent from the first clock domain and the third clock domain, the synchronization circuit 530 is still capable of temporarily storing the control information by using a corresponding circuit operating according to the second clock in the synchronization circuit 530, and then outputs the control information to a target clock domain after the clock signals of the first clock domain or the third clock domain are restored. The second clock domain is, for example, the CPort clock domain defined in the UniPro specification, or can be implemented by another clock domain independent from the first clock domain of the data link layer receiver (DL RX) circuit 510 and the third clock domain of the data link layer transmitter (DL TX).

Figure 6:
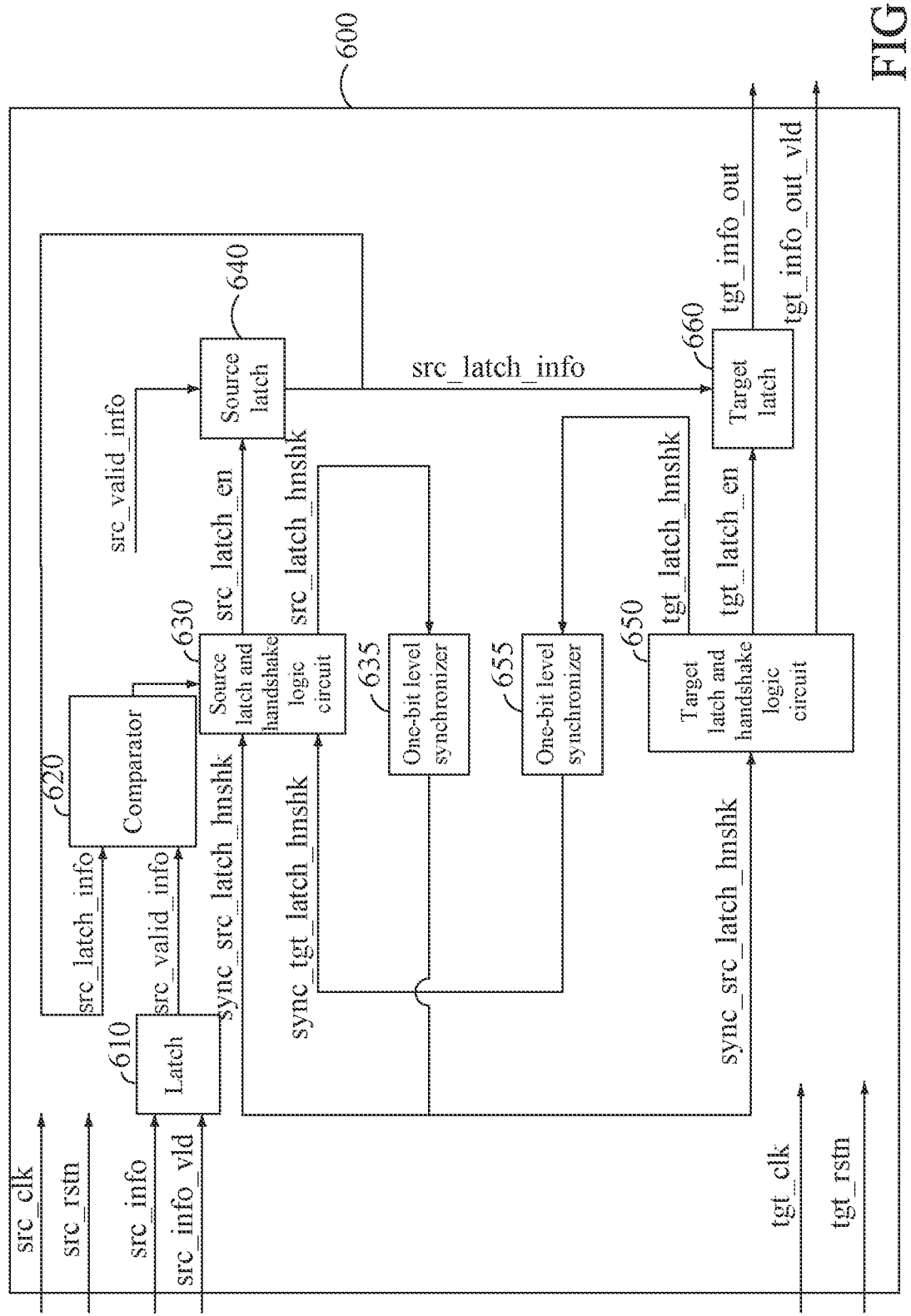
FIG. 6 shows a schematic diagram of an embodiment of the synchronization circuit module in FIG. 5.

Refer to FIG. 6 showing a schematic diagram of an embodiment of the synchronization circuit module in FIG. 5. A synchronization circuit module 600 in FIG. 6 is an embodiment of the synchronization circuit module in FIG. 5. The synchronization circuit module 600 is implemented on the basis of two sets of circuit units operating in asynchronous clock domains, and can include a latch 610, a comparator 620, a source latch and handshake logic circuit 630, a source latch 640, a target latch and handshake logic circuit 650 and a target latch 660, as shown in FIG. 6. The latch 610, the comparator 620, the source latch and handshake logic circuit 630, and the source latch 640 operate in a source clock domain; the target latch and handshake logic circuit 650 and the target latch 660 operate in a target clock domain. The synchronization circuit module 600 further includes a one-bit level synchronizer 635 and a one-bit level synchronizer 655.

Moreover, the synchronization circuit module 600 based on FIG. 6 can be configured individually for implementation of multiple synchronization circuit modules of the data link layer synchronization circuit 530 shown in FIG. 5. For example, when the synchronization circuit module 531 in FIG. 5 is implemented based on the synchronization circuit module 600 in FIG. 6, the source clock domain and the target clock domain of the synchronization circuit module 600 are respectively the first clock domain (for example, TD_RX) and the second clock domain (for example, TD_CP) in the foregoing embodiment of the synchronization circuit module 531, respectively. For example, when the synchronization circuit module 533 in FIG. 5 is implemented based on the synchronization circuit module 600 in FIG. 6, the source clock domain and the target clock domain of the synchronization circuit module 600 are respectively the second clock domain (for example, TD_CP) and the third clock domain (for example, TD_TX) in the foregoing embodiment of the synchronization circuit module 533, respectively. As such, by implementing the synchronization circuit modules 531 and 533 on the basis of FIG. 6, the second clock domain (for example, TD_CP) can be used as a relay clock domain in the process of synchronous transmission of control information. Similarly, the synchronization circuit module 535 or 537 shown in FIG. 5 can also be configured individually on the basis of the synchronization circuit module 600 in FIG. 6 and be accordingly implemented.

The synchronization circuit module 600 is described below in terms of examples. For example, the synchronization circuit module 600 receives source clock signals src_clk and src_rstn from a source clock domain and target clock signals tgt_clk and tgt_rstn from a target clock domain. The synchronization circuit module 600 performs bus synchronization on source information signals src_info and scr_info_vld and outputs target information signals tgt_info_out and tgt_info_out_vld. The signal src_info_vld indicates whether src_info is valid, and the signal tgt_info_out_vld indicates whether tgt_info_out is valid. The source information signal src_info and the target information signal tgt_info_out can respectively represent and be implemented as multi-bit bus information.

The latch 610 outputs a source valid information signal src_valid_info according to the source information signals scr_info and scr_info_vld. The comparator 620 outputs, according to the source valid information signal src_valid_info and a source latch information signal src_latch_info, a difference indication signal to indicate whether there is a difference between the source valid information signal and the source latch information signal. The source latch and handshake logic circuit 630 outputs a source latch enable signal src_latch_en and a source latch handshake signal src_latch_hnshk according to the difference indication signal, a synchronization source latch handshake signal sync_scr_latch_hnshk, and a synchronization target latch handshake signal sync_tgt_latch_hnshk. The one-bit level synchronizer 635 outputs the synchronization source latch handshake signal sync_src_latch_hnshk according to the source latch handshake signal src_latch_hnshk. The source latch 640 outputs the source latch information signal src_latch_info according to the source valid information signal src_valid_info and the source latch enable signal src_latch_en. To enable the synchronization circuit module 600 to perform an initial operation, the source latch 640 can be configured to have a predetermined latch value as the source latch information signal src_latch_info, for the comparator 620 to perform comparison. The target latch and handshake logic circuit 650 outputs a target latch handshake signal tgt_latch_hnshk, a target latch enable signal tgt_latch_en and a target information signal tgt_info_out_vld according to the synchronization source latch handshake signal sync_src_latch_hnshk. The one-bit synchronizer 655 outputs the synchronization target latch handshake signal sync_tgt_latch_hnshk according to the target latch handshake signal tgt_latch_hnshk. The target latch 660 outputs the target information signal tgt_info_out according to the source latch information signal src_latch_info and the target latch enable signal tgt_latch_en.

In FIG. 6, the synchronization circuit module 600 can be configured to implement two technical schemes for bus synchronization. One of the schemes is a "difference trigger" scheme, and the other is a "multi-phase latch" scheme.

Implementation examples of difference trigger (DT) and multi-phase latch (ML) bus synchronization are provided below to support the requirements of the technical issues above.

For example, bus information synchronization is achieved by handshake between a source clock domain and a target clock domain. In operations of a UniPro data link layer, control information to be exchanged is not always active, that is, such control information to be exchanged is not a constant existence. Only in case a change when a data link layer receives or transmits a TC0 or AFC0 frame, bus information synchronization of the control information to be exchanged is then needed. First of all, an embodiment of a technical scheme that performs bus information synchronization only when a change occurs in control information to be exchanged is provided, and this scheme is referred to as a difference trigger (DT) scheme. Difference trigger can reduce power consumption, because its synchronization is effective only when a change occurs in valid information.

Secondly, to achieve correct and rapid bus synchronization, the multi-phase latch (ML) scheme uses a first number of cycles (for example, cycles of source latch points) of the source clock domain and a second number of cycles (for example, cycles of target latch points) of the target clock domain during the exchange of control information. For example, the first number may be equal to or greater than the second number; for example, source information can be latched as quickly as possible when the first number is four cycles (or to be referred to as four phases). As such, it is beneficial to reduce the probability of missing before the RX symbol clocks are turned off.

In some embodiments, the two schemes above can be combined into a difference trigger and multi-phase latch (DTML) bus synchronization scheme.

Control information synchronization of the UniPro data link layer can be realized by various implementation manners on the basis the DTML bus synchronization scheme. In some embodiments below, a type of implementation is referred to as a normal scheme and another type of implementation is referred to as an enhanced scheme.

Figure 7:
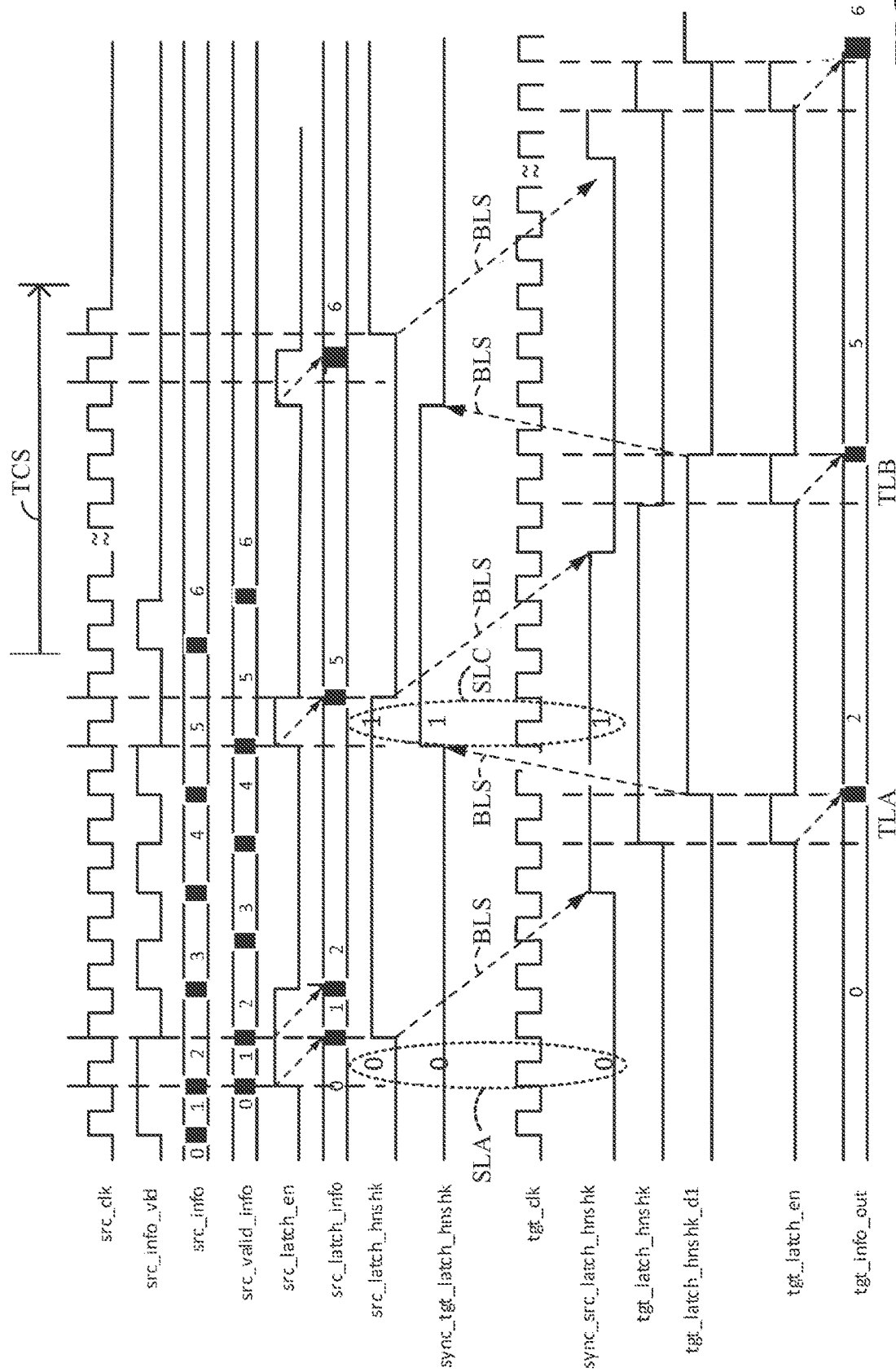
FIG. 7 shows a schematic timing diagram of an embodiment of the synchronization circuit module in FIG. 6.

Refer to FIG. 7 showing a schematic timing diagram of an embodiment of the synchronization circuit module in FIG. 6. FIG. 7 shows a timing diagram of a DTML bus synchronization scheme. For better illustration, waveforms of pulses are used to represent changes in the signals and changes in the levels of these signals. In implementation, delays may occur among these signals. FIG. 7 shows multiple signals of two sets of circuit units in the synchronization circuit module 600 as in the embodiment above. One set of circuit units in the synchronization circuit module 600 operate at an operating frequency of the source clock domain according to the source clock signal src_clk, the source information signal src_info_vld indicates whether the source information signal src_info is valid, and there may be a change in a value (for example, the frame sequence number or credit value) carried in the source information signal src_info. For better illustration, as shown in FIG. 7, the value carried in the source information signal Src_info, for example, changes from 0x0, 0x1, 0x2 to 0x6; in implementation, the value can be different from the values in FIG. 7 or the value can change irregularly. The latch 610 of the synchronization circuit module 600 outputs the source valid information signal src_valid_info according to the source information signals src_info and src_info_vld. When the source latch enable signal src_latch_en is set to an asserted state (for example, at a high level), the source latch 640 latches the value of the source valid information signal src_valid_info and thus outputs the source latch information signal src_latch_info, as latching and outputting value represented by dashed arrows between the corresponding waveforms of src_latch_en and src_latch_info in FIG. 7, for example, 0, 1 and 2, or 5 or 6 shown in the waveform of src_latch_info. When the value output by the source latch 640 is stable, the source latch and handshake logic circuit 630 and the target latch and handshake logic circuit 650 in the synchronization circuit module 600 handshake with each other. If the handshake is successful, the target latch enable signal tgt_latch_en is set to an asserted state, so that the target latch 660 is prompted to start latching the source latch information signal src_latch_info output by the source latch 640, and the target latch 660 then outputs the target information signal tgt_info_out, for example, 0, 2, 5 and 6 as shown in the waveform of tgt_info_out.

As shown in FIG. 7, two common source latch points SLA and SLC represent timings at which the source latch latches the source information, for example, SLA and SLC represented by the dashed ellipses. Moreover, two target latch points TLA and TLB represent timings at which the target latch latches updated source information, for example, TLA and TLB corresponding to solid squares in the waveform of tgt_info_out. It should be noted that, the source clock signal src_clk in FIG. 7 may be turned off; for example, the trailing clock cycles, as indicated by TCS in FIG. 7, can be configured to turn off the source clock signal when having reached a predetermined number (for example, 32 or other). Furthermore, in FIG. 7, dashed arrows are used to represent bit level synchronization (BLS) between src_latch_hnshk and sync_src_latch_hnshk.

As shown in FIG. 7, after the source latch 640 latches information at the source latch points SLA and SLC, when the source valid information signal src_valid_info updates the next set of information again (for example, the value thereof is 0x6), the set of updated information can be latched after the previous handshake is completed if the source clock signal is still present.

Figure 8:
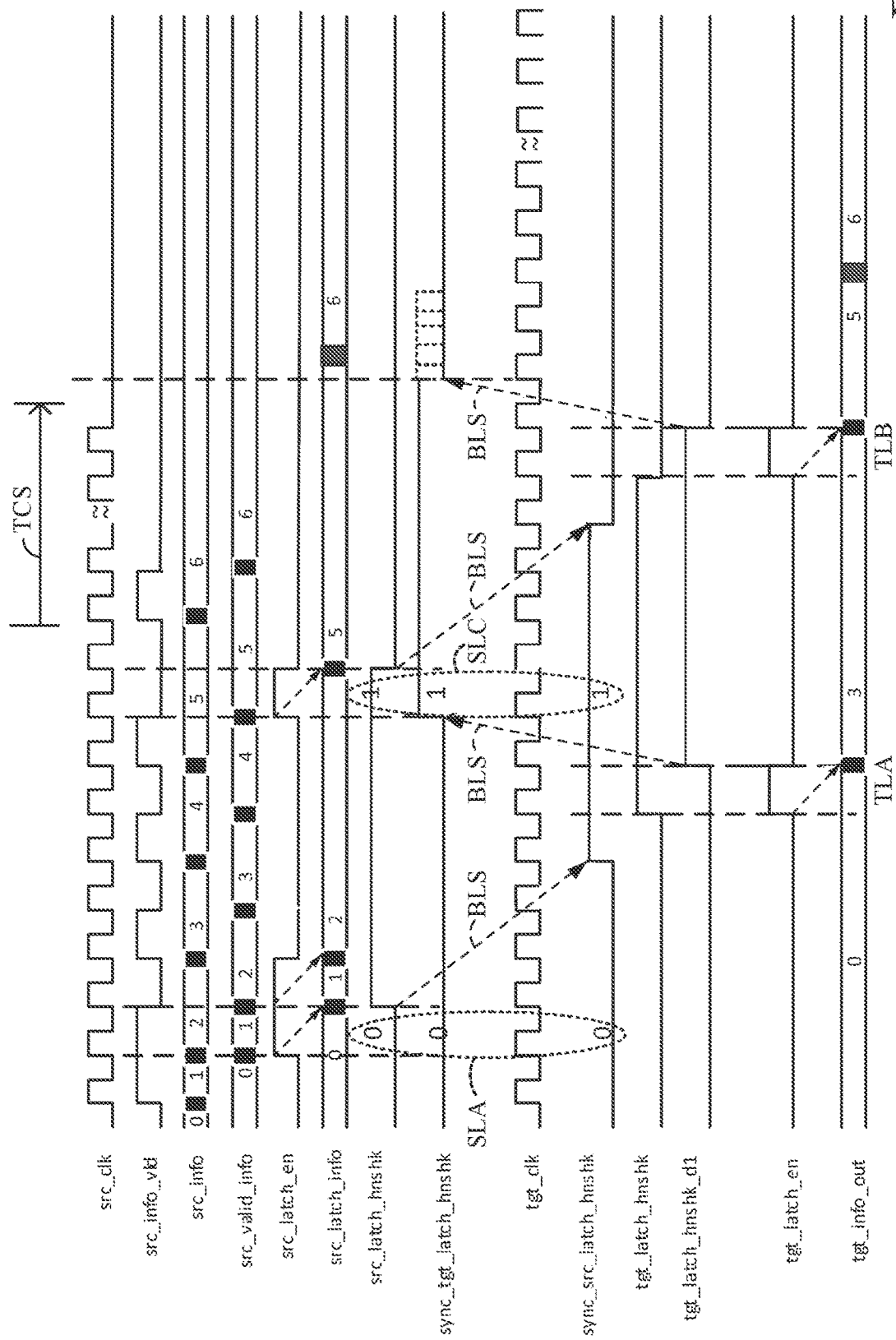
FIG. 8 shows a schematic timing diagram of another embodiment of the synchronization circuit module in FIG. 6.

In some examples, a situation may occur that the source clock signal is turned off after multiple clock cycles, and the target clock signal tgt_clk is much slower than the source clock signal src_clk. Such situation means that a clock frequency ratio between the source clock signal src_clk and the target clock signal tgt_clk is quite large, and so synchronous latency exceeds the cycle of the receiver (RX) trailing clock. Regarding the situation above, refer to FIG. 8 showing a schematic timing diagram of another embodiment of the synchronization circuit module in FIG. 6. FIG. 8 shows a timing diagram of a situation with possible miss (when synchronous latency exceeds the cycle of the RX trailing clock) in a normal scheme of DTML bus synchronization. In FIG. 8, the last multiple falling edges in dashed line in the waveform of the synchronization target latch handshake signal sync_tgt_latch_hnshk indicate the occurrence of miss of the source clock. Thus, the source valid information signal src_valid_info may have missed when the value thereof is 0x6, and is not latched in the source clock domain at the source latch 640. In the situation above, it is impossible for the target information signal tgt_info_out to output the value 0x6.

To reduce the possibility of such miss, in some embodiments, another type of implementation, that is, the enhanced scheme, can further be implemented, to provide more latch points in the source clock domain, for example, two additional latch points, thereby latching the source information as quickly as possible before the RX symbol clocks are turned off.

Figure 9:
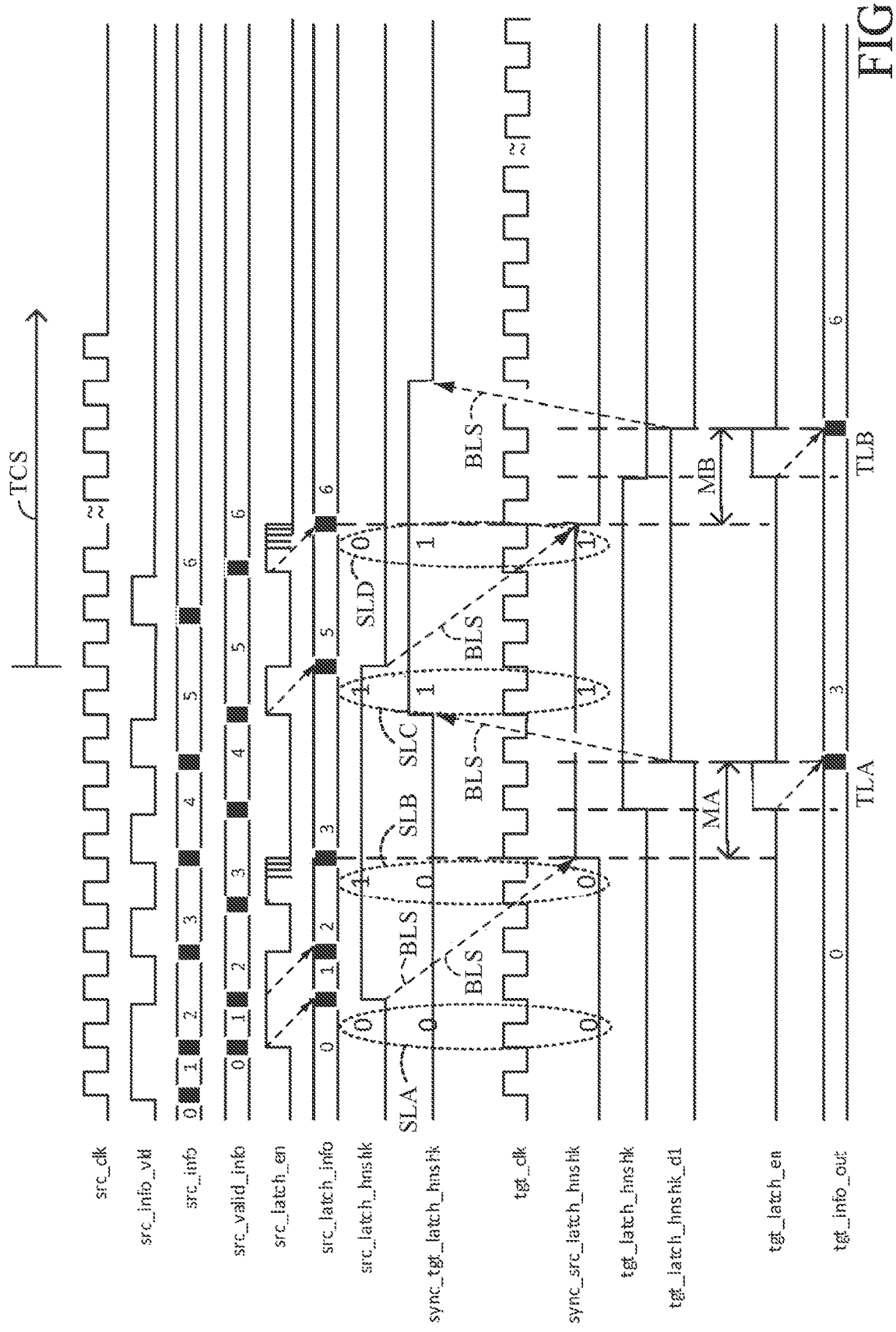
FIG. 9 shows a schematic timing diagram of yet another embodiment of the synchronization circuit module in FIG. 6.

Refer to FIG. 9 showing a schematic timing diagram of yet another embodiment of the synchronization circuit module in FIG. 6. The timing waveform of the enhanced scheme is as shown in FIG. 9. Compared to the embodiment of the normal scheme shown in FIG. 7 or FIG. 8, two source latch points are added to the embodiment of the enhanced scheme shown in FIG. 9, for example, a source latch point SLB and a source latch point SLD. Moreover, the embodiment of the enhanced scheme shown in FIG. 9 has two target latch points similar to those in the embodiment of the normal scheme shown in FIG. 7 or FIG. 8, for example, a target latch point TLA and a target latch point TLB.

After the source latch point SLB and the source latch point SLD and before the source information is latched at the target latch point, there are margins of at least two target clock cycles to ensure the stability of handshake, for example, the delay of two target clock cycles indicated by MA and MB in FIG. 9. An internal signal tgt_latch_hnshk_d1 is generated according to the target latch handshake signal tgt_latch_hnshk through delay, so that the target latch enable signal tgt_latch_en then serves as the target latch points, for example, as indicated by TLA and TLB, when the target latch enable signal tgt_latch_en changes from an asserted state to a de-asserted state.

Details operation of embodiments of difference trigger and multi-phase latch are illustrated in terms of examples below.

In difference trigger (DT), in the synchronization circuit module 600 shown in FIG. 6, the source information, when being valid, is latched at the latch 610 and the source valid information signal src_valid_info is output. The previously latched source information (for example, the source latch information signal src_latch_info) is compared with the valid source information (for example, information carried by the source valid information signal src_valid_info) are compared by the comparator 620 and a difference indication signal is output, wherein in an initial stage, the source latch information signal src_latch_info has a predetermined value. If the difference indication signal indicates the presence of a difference, then the source latch handshake signal (src_latch_hdshk) is triggered and the latest changed information (that is, the valid source information) is latched into the source latch 640 for the source latch 640 to output the source latch information signal src_latch_info. Afterwards, when the source information is valid and changed again, the bus synchronization logic is triggered to perform source latching and target latching at predetermined timings, as multi-phase timings shown below.

In multi-phase latch (ML), refer to FIG. 9 showing an example of an operation of an enhanced difference trigger and multi-phase latch bus synchronization scheme. After triggering takes place in the presence of a difference from the comparison performed by the comparator 620, there are two latches in two clock domains. One is in the source clock domain, and the other is in the target clock domain.

(1) In the source clock domain shown in FIG. 9, a first source latch starts from the source latch point SLA, the source latch handshake signal src_latch_hnshk is set to an asserted state, and synchronization (as indicated by the dashed line BLS shown in FIG. 9) with the target clock domain is performed through one-bit synchronization logic, so as to notify a circuit (for example, the target latch and handshake logic circuit 650) of the target clock domain that the source information has been latched and is stable.

(2) In the target clock domain, the target latch handshake signal tgt_latch_hnshk is set to an asserted state so that the source latch information signal src_latch_info is latched as the target information signal tgt_info_out at the target latch point TLA, as indicated by dashed arrows shown between the waveform of tgt_latch_en and tgt_info_out in FIG. 9.

(3) The target latch handshake signal tgt_latch_hnshk is synchronized (as indicated by the dashed line BLS shown in FIG. 9) with the source clock domain through the one-bit synchronization logic, so as to notify a circuit (for example, the source latch and handshake logic circuit 630) of the source clock domain that the target latch 660 has latched the source information.

(4) Then, if there is a difference between the source valid information signal src_valid_info and the source latch handshake signal src_latch_hnshk at the source latch point SLC, the source latch 640 can latch information again.

(5) After the handshake is complete, the source latch handshake signal src_latch_hnshk is set to a de-asserted state, and the target latch handshake signal tgt_latch_hnshk is also set to a de-asserted state, so that the source latch information signal src_latch_info is latched again as the target information signal tgt_info_out at the target latch point TLB, as indicated by the value 0x6 shown in the waveform of tgt_info_out in FIG. 9.

In the embodiment of the enhanced scheme, there are two additional source latch points so as to latch the source information quickly during the handshake.

(1) The source latch point SLB is a timing at which the source information is again changed before the target latch 660 starts latching the source latch information signal src_latch_info. The source information can be latched as quickly as possible.

(2) The source latch point SLD is a timing at which the source information is again changed after the target latch 660 latches the source latch information signal src_latch_info. The source information can be latched as quickly as possible.

In some embodiments, four source latch points can be determined by using equation (1) in Table 1 below, and are represented by a hardware description language (HDL), for example, Verilog. For illustration purposes, as shown in Table 1, equation (1) can be further represented as: src_latch_en=(conditional A and (conditional B1 or conditional B2 or conditional B3 or conditional B4)).

TABLE 1

| Equation (1) | Notes |
|---|---|
| src_latch_en = <br> ( (src_latch_info != src_valid_info) & <br> ( <br>   ( (~src_latch_hnshk) & (~sync_tgt_latch_hnshk) ) <br>   \| <br>   (   src_latch_hnshk  & sync_tgt_latch_hnshk  ) <br>   \| <br>   (   src_latch_hnshk  & (~sync_src_latch_hnshk) ) <br>   \| <br>   ( (~src_latch_hnshk) &   sync_src_latch_hnshk  ) <br> ) <br> ); | src_latch_en = <br> (Conditional A1 and <br> ( <br> Conditional B1 <br> or <br> Conditional B2 <br> or <br> Conditional B3 <br> or <br> Conditional B4) <br> )) |

When the conditional A1 is established, it indicates that the source information is valid and has changed. When the conditional B1 is established, it indicates that the first source latch point (SLA) is a timing of a rising edge of the source latch handshake signal src_latch_hnshk when the handshake starts, wherein the source latch handshake signal src_latch_hnshk and the synchronization target latch handshake signal sync_tgt_latch_hnshk are in an inactive state. When the conditional B2 is established, it indicates that the third source latch point (SLC) is a timing of a falling edge of the source latch handshake signal src_latch_hnshk when the handshake ends, wherein the source latch handshake signal src_latch_hnshk and the synchronization target latch handshake signal sync_tgt_latch_hnshk are in an active state. When the conditional B3 is established, it indicates that the second source latch point (SLB) is a timing at an intermediate stage of the handshake, wherein the source latch handshake signal src_latch_hnshk is in an active state and the synchronization target latch handshake signal sync_tgt_latch_hnshk is in an inactive state. When the conditional B4 is established, it indicates that the fourth source latch point (SLD) is a timing at an intermediate stage of the handshake, wherein the source latch handshake signal src_latch_hnshk is in an inactive state and the synchronization target latch handshake signal sync_tgt_latch_hnshk is in an active state.

In some embodiments, two target latch points can be determined by using equation (2), as follows: tgt_latch_en=tgt_latch_hnshk^tgt_latch_hnshk_d1. Equation (2) means that the target latch enable signal tgt_latch_en can be implemented as being determined according to a logic operation (for example, an exclusive or operation XOR) on the target latch handshake signal tgt_latch_hnshk and the internal signal tgt_latch_hnshk_d1 generated by delaying the target latch handshake signal tgt_latch_hnshk.

From the embodiment in FIG. 9, the synchronous latency from the source clock domain to the target clock domain can be reduced to several target clock cycles (for example, 0x3 to 0x5 cycles), and thus multi-phase latch can effectively reduce the possibility of miss of information when the source clocks are turned off. Moreover, from FIG. 7 to FIG. 9, in the implementation of the synchronization circuit module 600, the value carried in the source control information such as the source information signal src_info changes, for example, from 0x0 to 0x6; when the source information signal src_info no longer changes (for example, 0x6), the control information latched by the source latch 640 and the target latch 660 is consistent. Since what the synchronization circuit module 600 needs to transmit synchronously is control information, it is not necessary to perform synchronous transmission for every value of the source information signal src_info during the change thereof. As shown in FIG. 9, the value carried in the source information signal src_info changes, for example, from 0x0 to 0x6, and the control information of the target information signal tgt_info_out output by the synchronous transmission of the synchronization circuit module 600 is 0x0, 0x3 and 0x6. Thus, the control information 0x0, 0x3, and 0x6 is sufficient for the use of a credit-based flow control mechanism in an interconnection protocol (for example, UniPro). As such, in a high-speed transmission application scenario, for example, in high-speed transmission in the order of gigabit per second under the UniPro specification, the synchronization circuit module 600 also helps reduce power consumption.

In some embodiments, the synchronization circuit module in the architecture shown in FIG. 5 can be configured for implementation using the above normal scheme to have at least two source latch points (for example, SLA and SLC).

In some embodiments, the synchronization circuit module in the architecture shown in FIG. 5 can be configured for implementation based on the normal scheme to further realize an enhanced scheme, so as to achieve at least having four source latch points (for example, SLA, SLB, SLC and SLD), wherein two source latch points (such as SLB and SLD) are used, such as using the synchronization source latch handshake signal sync_src_latch_hnshk directly from the target clock domain to the source clock domain to ensure that there are at least two target clock cycle margins.

In some embodiments, the synchronization circuit module in the architecture shown in FIG. 5 can be configured to latch, while performing the information exchange, first control information in a first clock domain, latch the first control information in the second clock domain after a first number of cycles (for example, cycles corresponding to the source latch points (for example, SLA and SLC; or SLA, SLB, SLC, and SLD)) of the first clock domain and a second number of cycles (for example, cycles corresponding to the target latch points (for example, TLA or TLB)) of the second clock domain, and output the first control information latched in the second clock domain as the second control information. In one embodiment, the synchronization circuit module in the architecture shown in FIG. 5 is configured for performing the information exchange with the first number equal to the second number (as shown in FIG. 7 and FIG. 8). In one embodiment, the synchronization circuit module in the architecture shown in FIG. 5 is configured for performing the information exchange with the first number greater than the second number; as shown in FIG. 9, the source latch points (for example, SLA, SLB, SLC and SLD) correspond to four cycles, and the target latch points (for example, TLA and TLB) correspond to two cycles.

Moreover, although the numerous embodiments above are described with respect to a change occurring when the TC0 entity (for example, 325 in FIG. 3) of the data link layer receives or transmits TC0 or AFC0 frames to perform bus information synchronization on the control information to be exchanged, these numerous embodiments above are also applicable to TC1 or AFC1 frames. Therefore, optionally, in some embodiments, for TC1 or AFC1 frames, the TC1 entity (for example, 326 in FIG. 3) can be implemented in the data link layer, and a synchronization circuit similar to that in FIG. 5 can be implemented between DL_RX and DL_TX in the TC1 entity for synchronous transmission of control information.

Moreover, in the embodiments related to the host and the storage device, hardware protocol engines in the host controller or the device controller can be designed based on Hardware Description Language (HDL) such as Verilog or techniques of any other design methods of digital circuits generally known to a person skilled in the art, and can be implemented by one or more circuits based on such as a field programmable gate array (FPGA), an application-specific integrated circuit (ASIC) or a complex programmable logic device (CPLD), or be implemented by a dedicated circuit or module. The host controller or the device controller (or a processing unit or a hardware protocol engine therein) can also be implemented based on a microcontroller, a processor or a digital signal processor (DSP).

In some embodiments, when the synchronization circuit module in the circuit architecture shown in FIG. 5 is implemented by using an ASIC, a "synchronizer" can serve as a macro cell so as to reduce data path latency in the ASIC to the maximum extent possible.

In some embodiments, when the synchronization circuit module in the circuit architecture shown in FIG. 5 is implemented by using an FPGA, the attribute "ASYNC_REG" or "set_max_delay" in the FPGA is used to ensure that a source register and a target register are not distanced too far apart.

As described above, various embodiments of the technique of synchronization circuits for an interconnection protocol are provided, for example, a synchronization circuit for an interconnection protocol, a controller, and a storage device. For example, the data link layer synchronization circuit 530 is used for synchronous transmission of control information between the data link layer receiver (DL RX) circuit and the data link transmitter (DL TX) circuit, wherein the data link layer synchronization circuit 530 can include multiple synchronization circuit modules, which can be individually configured so as to satisfy the purpose of synchronous transmission of control information under the UniPro specification. The synchronization circuit module can be implemented according to the difference trigger (DT) and multi-phase latch (ML) bus synchronization in the above embodiments, and only starts to latch exchange information when a change occurs in the valid information. Thus, it is not necessary to update information at any time and power consumption can be reduced, so as to facilitate correct and quick exchange of, for example, control information of a UniPro data link layer, and save power consumption.

The present disclosure is disclosed by way of the multiple embodiments above. A person skilled in the art should understand that, these embodiments are merely for illustrating the present disclosure and are not to be construed as limitations to the scope of the present disclosure. It should be noted that all equivalent changes, replacements and substitutions made to the embodiments are encompassed within the scope of the present disclosure. Therefore, the scope of legal protection of the present disclosure should be defined by the appended claims.

What is claimed is:

1. A synchronization circuit for an interconnection protocol, the synchronization circuit comprising:
   a first synchronization circuit module configured to convert first control information of a first clock domain, wherein the first control information is output by a data link layer receiver of a first device, into second control information of a second clock domain; and
   a second synchronization circuit module, coupled to the first synchronization circuit module, configured to convert the second control information of the second clock domain, wherein the second control information is output by the first synchronization circuit module, into third control information of a third clock domain to output the third control information of the third clock domain to a data link layer transmitter of the first device;
   wherein the first control information output by the data link layer receiver is at least one signal of the first clock domain;
   wherein the third control information output by the second synchronization circuit module is at least one signal of the third clock domain; and
   wherein the first clock domain, the second clock domain, and the third clock domain are asynchronous.

2. The synchronization circuit according to claim 1, wherein when a frame receiving processing unit of the data link layer receiver completes processing of a data frame and successfully transmits the data frame to an upper layer, the first control information of the first clock domain output by the frame receiving processing unit is converted into the third control information of the third clock domain through the first synchronization circuit module and the second synchronization circuit module of the synchronization circuit so as to output the third control information of the third clock domain to the data link layer transmitter.

3. The synchronization circuit according to claim 1, wherein after a frame receiving processing unit of the data link layer receiver correctly receives a control frame, the first control information of the first clock domain output by the data link layer receiver is converted into the third control information of the third clock domain through the first synchronization circuit module and the second synchronization circuit module of the synchronization circuit so as to output the third control information of the third clock domain to the data link layer transmitter.

4. The synchronization circuit according to claim 1, wherein the synchronization circuit further comprises:
   a third synchronization circuit module configured to convert fourth control information of the third clock domain, wherein the fourth control information is output by the data link layer transmitter, into fifth control information of the second clock domain and outputting the fifth control information of the second clock domain; and
   a fourth synchronization circuit module, coupled to the third synchronization circuit module, configured to convert the fifth control information of the second clock domain, wherein the fifth control information is output by the third synchronization circuit module, into sixth control information of the first clock domain to output the sixth control information of the first clock domain to the data link layer receiver,
   wherein the fourth control information output by the data link layer transmitter is at least another signal of the third clock domain, and the sixth control information output by the fourth synchronization circuit module is at least another signal of the first clock domain.

5. The synchronization circuit according to claim 4, wherein after the data link layer transmitter completes sending a data frame, the fourth control information of the third clock domain output by the data link layer transmitter is converted into the sixth control information of the first clock domain through the third synchronization circuit module and the fourth synchronization circuit module of the synchronization circuit so as to output the sixth control information of the first clock domain to the data link layer receiver.

6. The synchronization circuit according to claim 1, wherein the first synchronization circuit module is configured to perform information exchange only when the first control information output by the data link layer receiver is different from previous control information.

7. The synchronization circuit according to claim 6, wherein the first synchronization circuit module is configured to, while performing the information exchange, latch the first control information in the first clock domain, and latch the first control information in the second clock domain after a first number of cycles of the first clock domain and a second number of cycles of the second clock domain, and output the first control information latched in the second clock domain as the second control information.

8. The synchronization circuit according to claim 7, wherein the first synchronization circuit module is configured to perform the information exchange when the first number is equal to or greater than the second number.

9. A controller, the controller comprising:
   a controller module, coupled to an interface circuit and implementing a link layer of an interconnection protocol, the controller module comprising:
   a data link layer receiver;
   a data link layer transmitter; and
   a synchronization circuit coupled between the data link layer receiver and the data link layer transmitter, the synchronization circuit comprising:
     a first synchronization circuit module, configured to convert first control information of a first clock domain, wherein the first control information is output by the data link layer receiver of a first device, into second control information of a second clock domain; and
     a second synchronization circuit module, coupled to the first synchronization circuit module, configured to convert the second control information of the second clock domain, wherein the second control information is output by the first synchronization circuit module, into third control information of a third clock domain to output the third control information of the third clock domain to the data link layer transmitter;
     wherein the first control information output by the data link layer receiver is at least one signal of the first clock domain;
     wherein the third control information output by the second synchronization circuit module is at least one signal of the third clock domain; and wherein the first clock domain, the second clock domain, and the third clock domain are asynchronous.

10. The controller according to claim 9, wherein when a frame receiving processing unit of the data link layer receiver completes processing of a data frame and successfully transmits the data frame to an upper layer, the first control information of the first clock domain output by the frame receiving processing unit is converted into the third control information of the third clock domain through the first synchronization circuit module and the second synchronization circuit module of the synchronization circuit so as to output the third control information of the third clock domain to the data link layer transmitter.

11. The controller according to claim 9, wherein after a frame receiving processing unit of the data link layer receiver correctly receives a control frame, the first control information of the first clock domain output by the data link layer receiver is converted into the third control information of the third clock domain through the first synchronization circuit module and the second synchronization circuit module of the synchronization circuit so as to output the third control information of the third clock domain to the data link layer transmitter.

12. The controller according to claim 9, wherein the synchronization circuit further comprises:
a third synchronization circuit module, configured to convert fourth control information of the third clock domain, wherein the fourth control information is output by the data link layer transmitter, into fifth control information of the second clock domain and outputting the fifth control information of the second clock domain; and
a fourth synchronization circuit module, coupled to the third synchronization circuit module, configured to convert the fifth control information of the second clock domain, wherein the fifth control information is output by the third synchronization circuit module, into sixth control information of the first clock domain to output the sixth control information of the first clock domain to the data link layer receiver,
wherein the fourth control information output by the data link layer transmitter is at least another signal in the third clock domain, and the sixth control information output by the fourth synchronization circuit module is at least another signal of the first clock domain.

13. The controller according to claim 12, wherein after the data link layer transmitter completes sending a data frame, the fourth control information of the third clock domain output by the data link layer transmitter is converted into the sixth control information of the first clock domain through the third synchronization circuit module and the fourth synchronization circuit of the synchronization circuit so as to output the sixth control information of the first clock domain to the data link layer receiver.

14. The controller according to claim 9, wherein the first synchronization circuit module is configured to perform information exchange only when the first control information output by the data link layer receiver is different from previous control information.

15. The controller according to claim 14, wherein the first synchronization circuit module is configured to, while performing the information exchange, latch the first control information in the first clock domain, and latch the first control information in the second clock domain after a first number of cycles in the first clock domain and a second number of cycles in the second clock domain, and output the first control information latched in the second clock domain as the second control information.

16. The controller according to claim 15, wherein the first synchronization circuit module is configured to perform the information exchange when the first number is equal to or greater than the second number.

17. A storage device comprising:
a storage module;
an interface circuit implementing a physical layer of an interconnection protocol to link a host; and
a controller module, coupled to the interface circuit and the storage module, for implementing a link layer of the interconnection protocol, the controller module comprising:
a data link layer receiver;
a data link layer transmitter; and
a synchronization circuit coupled between the data link layer receiver and the data link layer transmitter, the synchronization circuit comprising:
a first synchronization circuit module, configured to convert first control information of a first clock domain, wherein the first control information is output by the data link layer receiver, into second control information of a second clock domain; and
a second synchronization circuit module, coupled to the first synchronization circuit module, configured to convert the second control information of the second clock domain, wherein the second control information is output by the first synchronization circuit module, into third control information of a third clock domain to output the third control information of the third clock domain to the data link layer transmitter;
wherein the first control information output by the data link layer receiver is at least one signal of the first clock domain;
wherein the third control information output by the second synchronization circuit module is at least one signal of the third clock domain; and
wherein the first clock domain, the second clock domain, and the third clock domain are asynchronous.

18. The synchronization circuit according to claim 1, wherein the third control information is utilized by the data link layer transmitter to begin transmitting a next data frame.

19. The controller according to claim 9, wherein the third control information is utilized by the data link layer transmitter to begin transmitting a next data frame.

20. The storage device according to claim 17, wherein the third control information is utilized by the data link layer transmitter to begin transmitting a next data frame.

* * * * *